United States Patent
Fukui

(10) Patent No.: US 7,923,756 B2
(45) Date of Patent: Apr. 12, 2011

(54) METAL OXIDE SEMICONDUCTOR (MOS) DEVICE COMPRISING A BURIED REGION UNDER DRAIN

(75) Inventor: Hironobu Fukui, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 28 days.

(21) Appl. No.: 12/131,044

(22) Filed: May 31, 2008

(65) Prior Publication Data

US 2008/0230851 A1 Sep. 25, 2008

Related U.S. Application Data

(62) Division of application No. 10/811,107, filed on Mar. 26, 2004, now Pat. No. 7,394,119.

(30) Foreign Application Priority Data

Nov. 28, 2003 (JP) ................................. 2003-399895

(51) Int. Cl.
*H01L 27/088* (2006.01)

(52) U.S. Cl. ... 257/202; 257/550; 257/401; 257/E27.06; 257/E27.098; 257/288; 257/E27.077

(58) Field of Classification Search .................. 257/288, 257/401, E27.098–E27.101, 202, 550, E27.06, 257/E27.077

See application file for complete search history.

(56) References Cited

U.S. PATENT DOCUMENTS

| 4,903,087 | A | | 2/1990 | Jerome et al. |
| 6,054,344 | A | * | 4/2000 | Liang et al. ................... 438/223 |
| 6,740,958 | B2 | | 5/2004 | Nakazato et al. |
| 2002/0005732 | A1 | * | 1/2002 | Yokomizo ..................... 324/769 |

FOREIGN PATENT DOCUMENTS

| JP | 5-13705 | | 1/1993 |
| JP | 05013705 | * | 1/1993 |
| JP | 07086418 | * | 3/1995 |
| JP | 2-277266 | | 12/2009 |
| JP | 2003-7067 | | 12/2009 |
| JP | 2003-173681 | | 12/2009 |

OTHER PUBLICATIONS

ISE TCAD Release 8.0, "ISE Part 11 Dessis," vol. 4a, pp. 11.273-11.280, ISE Integrated Systems Engineering, 1995-2002.
Derwent Abstract for US Patent No. 4,903,087.
Japanese Office Action dated Jul. 22, 2008 corresponding to the related Japanese Patent Application No. 2003-399895 (English and Japanese translations).

* cited by examiner

*Primary Examiner* — Bradley K Smith
*Assistant Examiner* — Mohammad T Karimy
(74) *Attorney, Agent, or Firm* — DLA Piper LLP (US)

(57) ABSTRACT

A semiconductor device with a metal oxide semiconductor (MOS) type transistor structure, which is used for, e.g. a static random access memory (SRAM) type memory cell, includes a part that is vulnerable to soft errors. In the semiconductor device with the MOS type transistor structure, an additional load capacitance is formed at the part that is vulnerable to soft errors.

10 Claims, 7 Drawing Sheets

METAL OXIDE SEMICONDUCTOR (MOS) DEVICE COMPRISING A BURIED REGION UNDER DRAIN

CROSS-REFERENCE TO RELATED APPLICATIONS

This is a division of application Ser. No. 10/811,107, filed Mar. 26, 2004, published as US2005/0116361A1, now U.S. Pat. No. 7,394,119, and is based upon and claims the benefit of priority from prior Japanese Patent Application No. 2003-399895, filed Nov. 28, 2003, the entire contents of all of which are incorporated herein by reference in entirety.

BACKGROUND

1. Field

The present invention relates to a MOS type semiconductor device and manufacturing method thereof. More particularly, the invention relates to a complementary MOS (CMOS) type field-effect transistor (FET).

2. Description of the Related Art

In the prior art, there is known an Static Random Access Memory (SRAM) as a device in which CMOS type field-effect transistors (FETs) are applied to its memory cells. In the case where CMOS FETs are applied to a memory cell of the SRAM, a problem will arise with the resistance to soft errors (see, e.g. Jpn. Pat. Appln. KOKAI Publication No. 6-310683).

Normally, a soft error rate (SER) becomes higher as the scaling of FETs increases. In particular, in the generation after the 90 nm technology node, the increase in SER poses a serious problem.

As mentioned above, in the SRAM in which CMOS FETs are applied to the memory cell, the resistance to soft errors is a problem to be solved. It is expected that the SER will rise with the increase in scaling of FETs. It is very difficult, however, to decrease the SER without degrading the circuit performance or increasing the chip area.

BRIEF SUMMARY OF THE INVENTION

According to a first aspect of the present invention, there is provided a semiconductor device having a metal oxide semiconductor (MOS) type transistor structure, comprising: an additional load capacitance that is formed at a part of the semiconductor device, which is vulnerable to soft errors.

According to a second aspect of the present invention, there is provided a semiconductor device having a metal oxide semiconductor (MOS) type transistor structure, comprising: a buried well region that is formed at a part of the semiconductor device, which is vulnerable to soft errors.

According to a third aspect of the present invention, there is provided a method of manufacturing a semiconductor device having a metal oxide semiconductor (MOS) type transistor structure, comprising: specifying by circuit simulation a part of the semiconductor device, which is vulnerable to soft errors; and forming an additional load capacitance at the part of the semiconductor device, which is vulnerable to soft errors.

According to a fourth aspect of the present invention, there is provided a method of manufacturing a semiconductor device having a metal oxide semiconductor (MOS) type transistor structure, comprising: specifying by circuit simulation a part of the semiconductor device, which is vulnerable to soft errors; and forming a buried well region at the part of the semiconductor device, which is vulnerable to soft errors.

DETAILED DESCRIPTION OF THE INVENTION

Embodiments of the present invention will now be described with reference to the accompanying drawings.

First Embodiment

Figure 1:
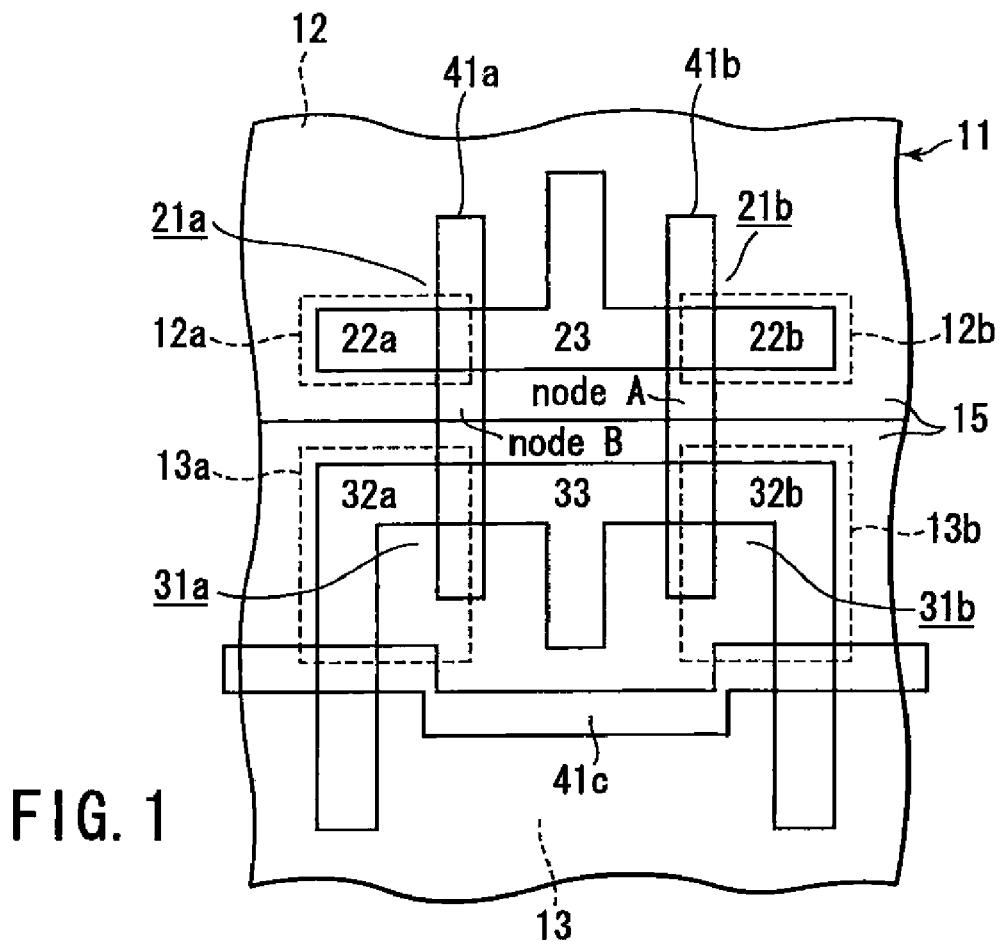
FIG. 1 is a plan view showing the basic structure of an SRAM cell according to a first embodiment of the present invention.

FIG. 1 shows the basic structure of a memory cell of an SRAM (hereinafter referred to as "SRAM cell") according to a first embodiment of the present invention. In this embodiment, a description is given of a case where the stability of the circuit against soft errors is improved by increasing a load capacitance. An SRAM with a cell size of, e.g. 1.26 μm×0.92 μm, in the generation of the 90 nm technology node is taken as an example.

As is shown in FIG. 1, an n-type well region (n-well) 12 and a p-type well region (p-well) 13 are provided adjacent to each other on a surface portion of a p-type semiconductor substrate (p-substrate) 11. In the n-well 12, p-type MOS transistors 21a and 21b are formed. Each of the p-type MOS transistors 21a and 21b comprises a drain region 22a, 22b and a source region 23, which are formed of p$^+$-type impurity diffusion layers. The source region 23 is shared by the p-type MOS transistors 21a and 21b.

On the other hand, n-type MOS transistors 31a and 31b are formed in the p-well 13. Each of the n-type MOS transistors 31a and 31b comprises a drain region 32a, 32b and a source region 33, which are formed of n-type impurity diffusion layers. The source region 33 is shared by the n-type MOS transistors 31a and 31b.

A common-gate electrode (first gate of SRAM cell) 41a is provided on an insulation film (not shown) over the p-type MOS transistor 21a and n-type MOS transistor 31a. In addition, a common gate electrode (second gate of SRAM cell) 41b is provided on an insulation film (not shown) over the p-type MOS transistor 21b and n-type MOS transistor 31b.

The actual SRAM cell is provided with lines (not shown) which respectively connect a node A and the drain region 32a, connect a node B and the drain region 32b, connect the drain region 22a and drain region 32a, and connect the drain region 22b and drain region 32b. Thereby, a flip-flop circuit, which employs the p-type MOS transistors 21a and 21b and the n-type MOS transistors 31a and 31b, is formed.

The source region 23 is connected to a power supply (Vdd) and the source region 33 is connected to a ground (Vss). A common gate electrode (third gate of SRAM cell) 41c is provided on an insulation film (not shown) over the drain regions 32a and 32b. The surface of the p-type semiconductor substrate 11, which excludes the formation regions of the p-type MOS transistors 21a, 21b and n-type MOS transistors 31a, 31b, is covered with an insulation film 15 for device isolation.

In the present embodiment, in order to increase the junction capacitances of, e.g. the drain region 22a, 22b, 32a, 32b, the well impurity concentration in the parts immediately below them is made higher than that in the other parts. Specifically, the impurity concentration in a well region (high-concentration well region) 12a immediately below the drain region 22a and the impurity concentration in a well region (high-concentration well region) 12b immediately below the drain region 22b are set to be higher than the concentration in the n-well 12. In addition, the impurity concentration in a well region (high-concentration well region) 13a immediately below at least a part of the drain region 32a and the impurity concentration in a well region (high-concentration well region) 13b immediately below at least a part of the drain region 32b are set to be higher than the concentration in the p-well 13.

The formation of the high-concentration well region 12a, 12b is realized, for example, by performing selective ion implantation, in addition to ordinary ion implantation at the time of forming the n-well 12. Similarly, the formation of the high-concentration well region 13a, 13b is realized, for example, by performing selective ion implantation, in addition to ordinary ion implantation at the time of forming the p-well 13.

Figure 2A:
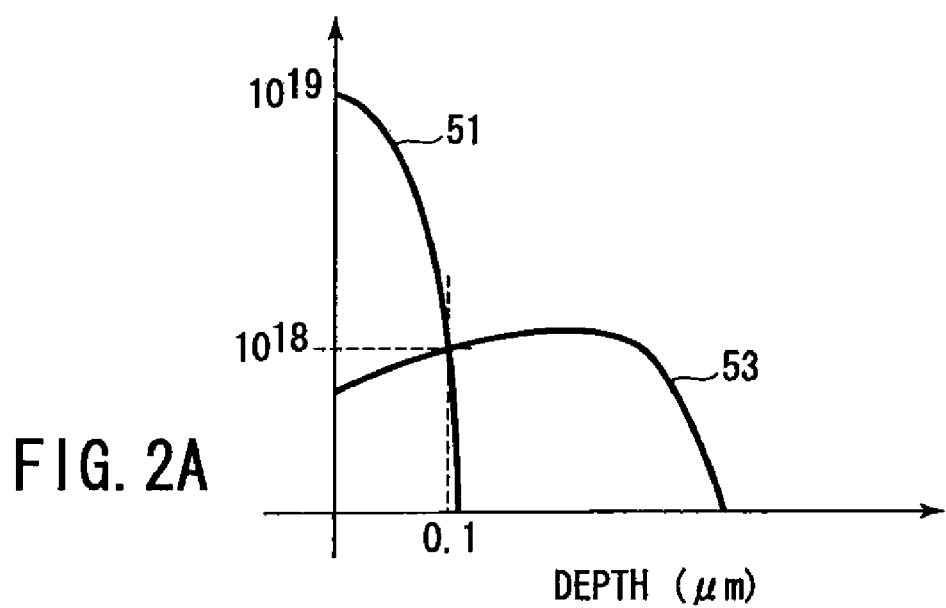
FIG. 2A and FIG. 2B are graphs showing impurity profiles of the SRAM cell shown in FIG. 1.
Figure 2B:
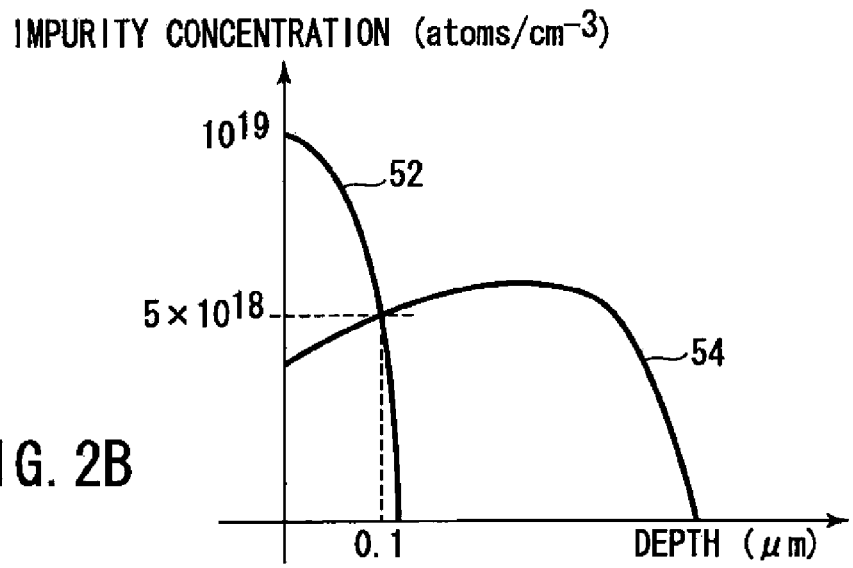

FIGS. 2A and 2B show impurity profiles in the SRAM cell having the above-described structure. FIG. 2A shows impurity profiles in the source region 23, 33, and FIG. 2B shows impurity profiles in the drain region 22a, 22b, 32a, 32b. In FIGS. 2A and 2B, a curve 51 indicates a profile in the diffusion layer (source region 23, 33), a curve 52 indicates a profile in the diffusion layer (drain region 22a, 22b, 32a, 32b), a curve 53 indicates a profile in the well (well region 12, 13), and a curve 54 indicates a profile in the well (high-concentration well region 12a, 12b, 13a, 13b).

In the present embodiment, as shown in FIG. 2B, for example, the impurity concentration at the junction interface between the diffusion layer 52 and well 54 is controlled at about $5\times10^{18}$ to $10^{19}/cm^3$ (the impurity concentration at the junction interface between the diffusion layer 51 and well 53 is about $10^{18}/cm^3$). Thereby, the junction capacitance of the drain region 22a, 22b, 32a, 32b increases up to about double the junction capacitance in the prior art. The increase in junction capacitance is equivalent to the increase in load capacitance. Hence, the resistivity to soft errors can be improved. As a result, the stability of the circuit against cosmic radiation is improved, compared to the conventional SRAM cell.

An increase in load capacitance, in usual cases, lowers the responsivity in circuit. In the present embodiment, only the load capacitance of the part, which is a place where a soft error will easily occur, that is, which is most vulnerable to soft errors, is intensively increased. Thereby, degradation in performance of the circuit is limited to a minimum necessary level.

Figure 3A:
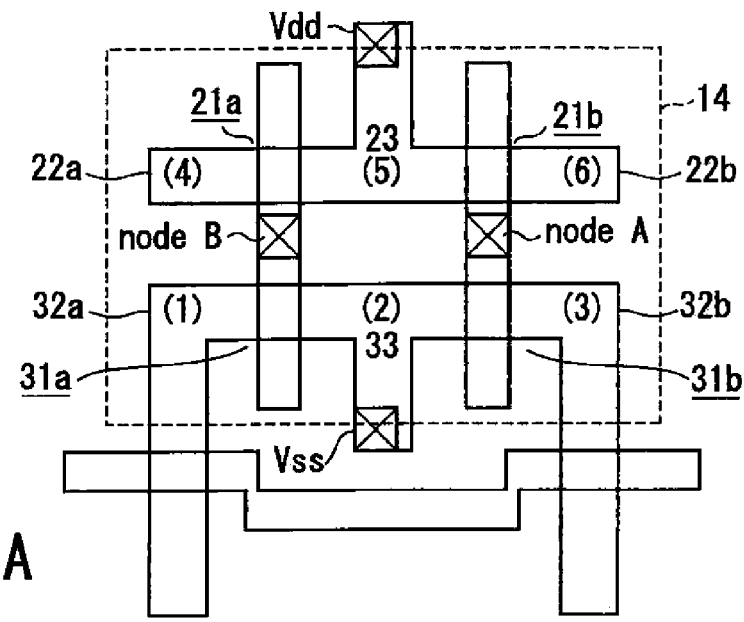
FIG. 3A and FIG. 3B are views for explaining a soft error in the SRAM cell.
Figure 3B:
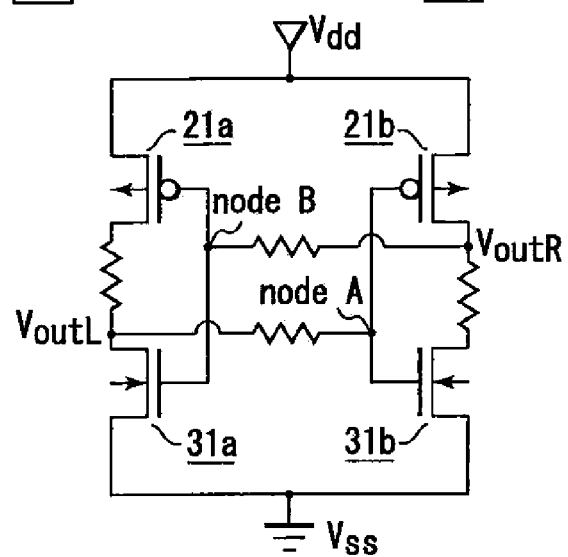
Figure 4A:
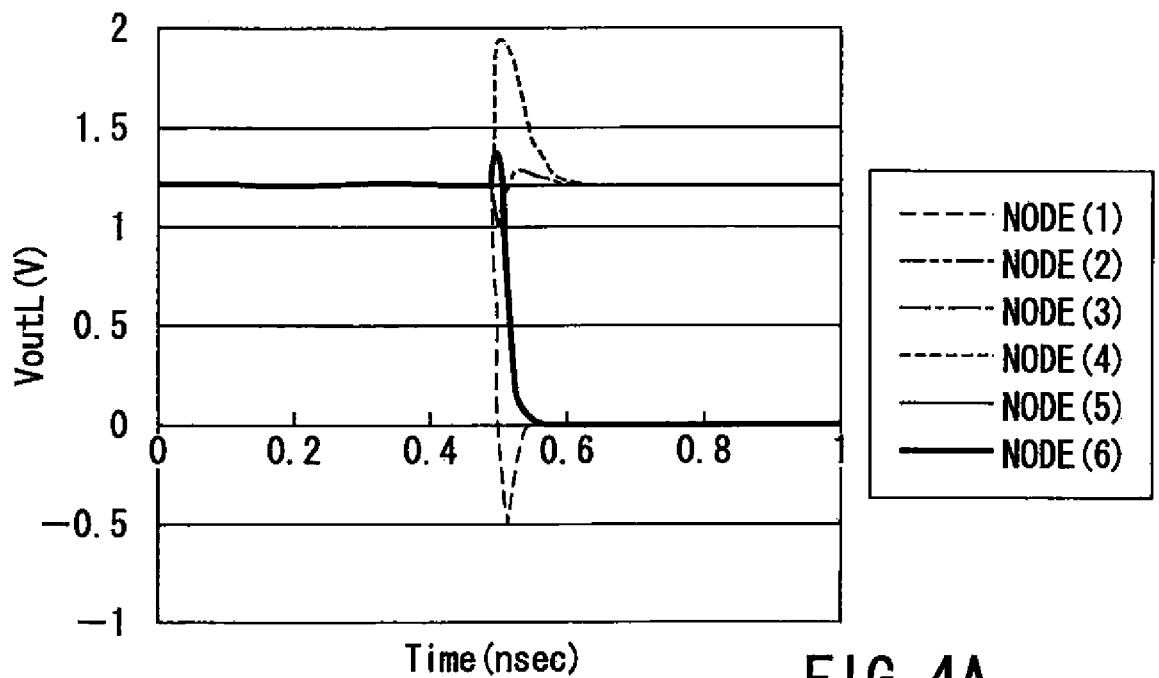
FIG. 4A and FIG. 4B are views for explaining a soft error in the SRAM cell.
Figure 4B:
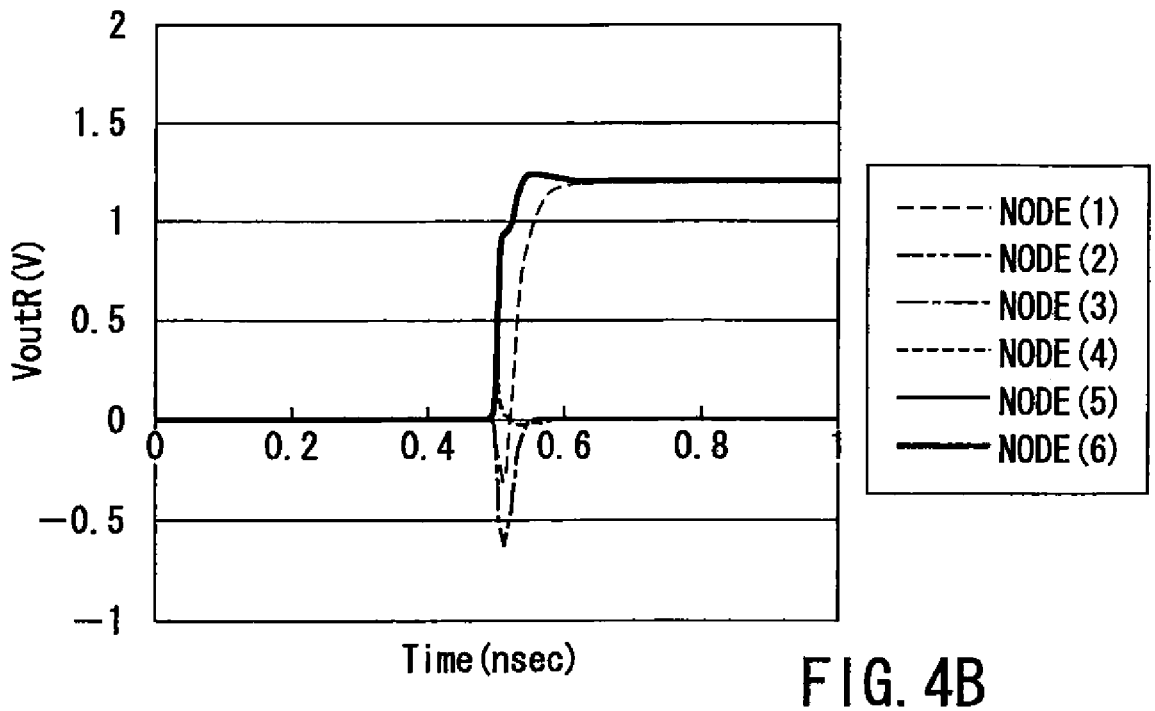

Referring now to FIGS. 3A and 3B and FIGS. 4A and 4B, a description is given of which part in the SRAM cell is vulnerable to soft errors, that is, where is the part at which a soft error will occur at highest probability when it receives cosmic radiation. FIG. 3A shows locations (nodes) where cosmic radiation is applied, and FIG. 3B shows an equivalent circuit of a transistor region 14 shown in FIG. 3A. FIG. 4A shows a variation with time in voltage at a node A (VoutL) when cosmic radiation is applied, and FIG. 4B shows a variation with time in voltage at a node B (VoutR) when cosmic radiation is applied, with respect to the locations of radiation of cosmic rays (node (1) to node (6)). FIG. 4A shows a result in a case where the initial state of the flip-flop circuit is VoutL=High Level, and FIG. 4B shows a result in a case where VoutR=Low Level.

As is clear from FIGS. 4A and 4B, it has turned out that in the SRAM cell with this structure, the state of the cell may most easily be inverted when cosmic radiation is applied to the node (1) and node (6), for example, as shown in FIG. 3A. This SRAM cell has a circuit configuration that is symmetric in the right-and-left direction. It is thus understood that when the initial state of the flip-flop circuit is VoutL=Low Level and VoutR=High Level, the state of the cell may most easily be inverted when cosmic radiation is applied to the node (3) and node (4), for example, as shown in FIG. 3A.

Taking the above into account, in the first embodiment, as described above, at least parts of the well regions 12a, 12b, 13a and 13b immediately below the drain regions 22a, 22b, 32a and 32b, which correspond to the nodes (1), (3), (4) and (6), are controlled to have high concentrations. Thus, the load capacitance of the parts, which are vulnerable to soft errors, is selectively increased, and the resistance to soft errors is improved.

The above-described first embodiment is suitable for the case where the soft error rate (SER) is to be decreased as much as possible. However, depending on products, more importance is placed on the circuit performance of the SRAM cell than on the reduction in SER. In order to maintain the circuit performance, it is preferable that the number of places of formation of high-concentration well regions be smaller. Hence, for the SRAM cell that places more importance on circuit performance, the nodes (1), (3), (4) and (6), for example, are ranked in an order beginning with the highest probability of soft errors. Then, with respect to the nodes that are ranked from the one with the highest probability of soft errors, the SER, which is obtained when the high-concentration well region 12a, 12b, 13a, 13b is formed, is calculated. Thus, the location of formation of the high-concentration well region, which can realize the SER with a target value or less, is determined.

Figure 5:
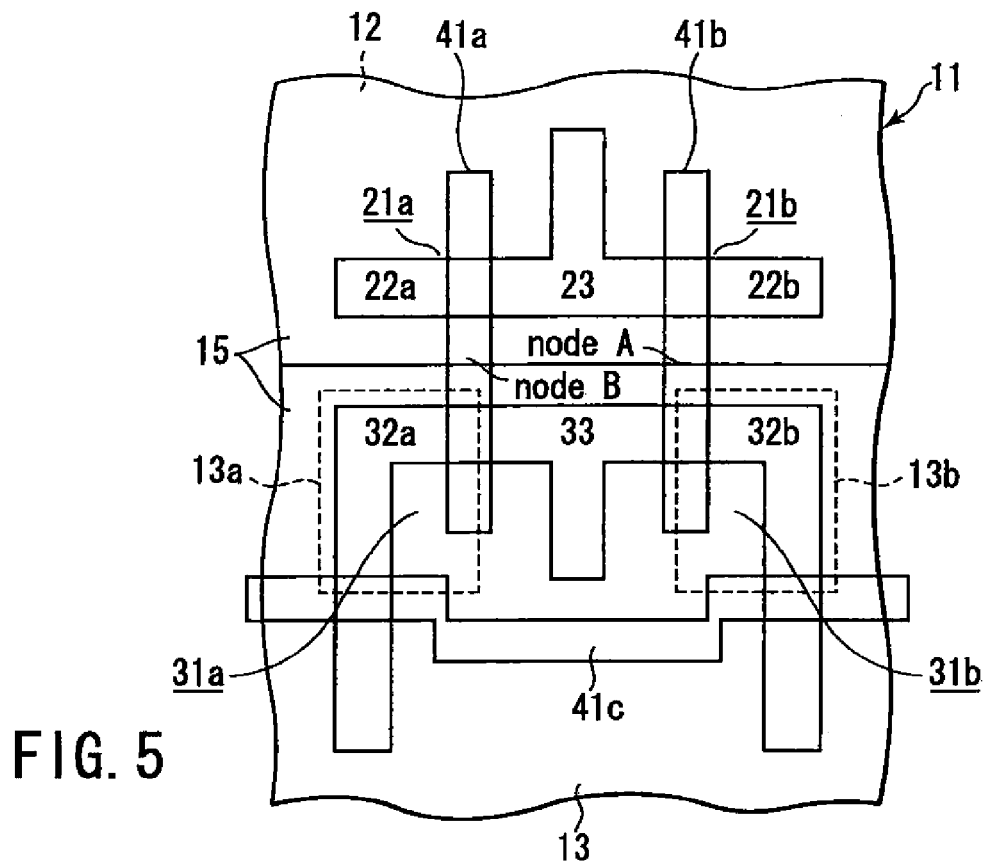
FIG. 5 is a plan view showing another example of the structure of the SRAM cell according to the first embodiment of the present invention.

In the case of the SRAM cell with the above-described structure, the data obtained thus far demonstrates that the probability of occurrence of soft errors is substantially equal between node (1) and node (3) and between node (4 and node (6), and that the probability of occurrence of soft errors at the node (1) is higher than that at the node (4). In this case, as shown in FIG. 5, for instance, high-concentration well regions 13a and 13b, which have higher concentrations than the p-well 13, are formed on at least parts immediately below the drain regions 32a and 32b that correspond to the node (1) and node (3). Thereby, degradation in circuit performance can be suppressed, compared to the case (see FIG. 1) where the high-concentration well regions 12a, 12b, 13a and 13b are formed on at least parts immediately below the drain regions 22a, 22b, 32a and 32b.

As has been described above, the load capacitance is intensively added to the locations that are vulnerable to soft errors. Thereby, the resistance to soft errors can be improved. Moreover, since the load capacitance can selectively be added, the increase in chip area or the degradation in circuit performance can be limited to a minimum necessary level.

Second Embodiment

Figure 6:
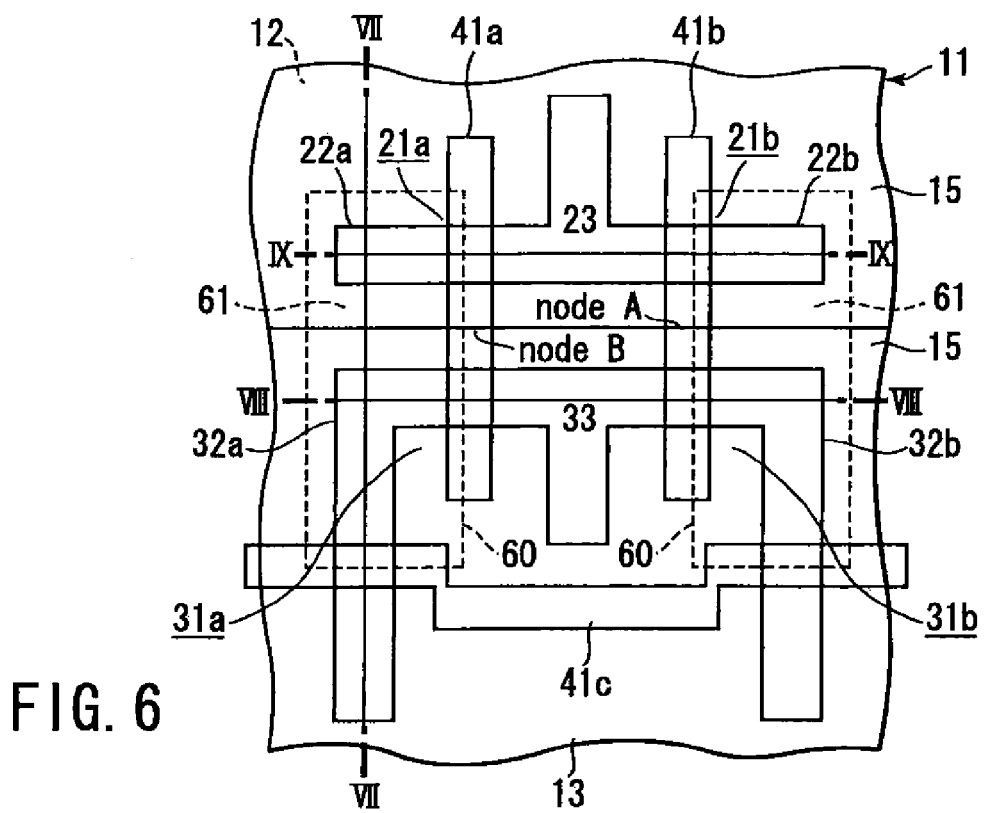
FIG. 6 is a plan view showing the basic structure of an SRAM cell according to a second embodiment of the present invention.
Figure 7:
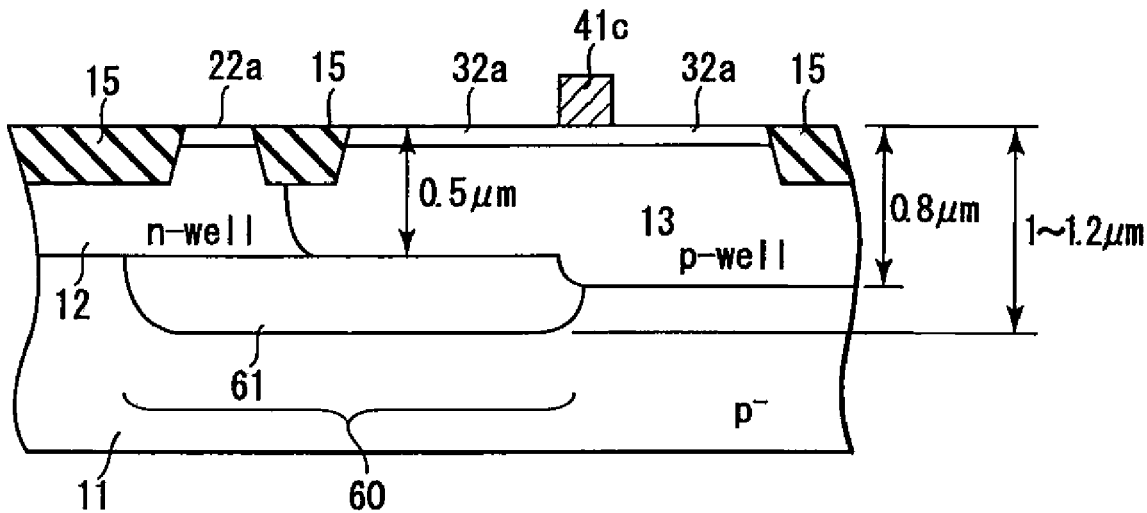
FIG. 7 is a cross-sectional view of the SRAM cell shown in FIG. 6, taken along line VII-VII.
Figure 8:
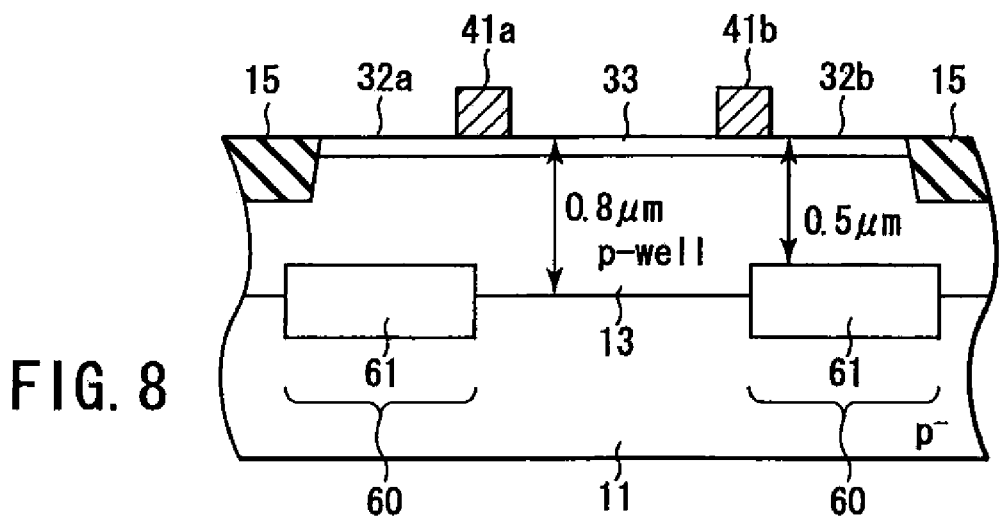
FIG. 8 is a cross-sectional view of the SRAM cell shown in FIG. 6, taken along line VIII-VIII.
Figure 9:
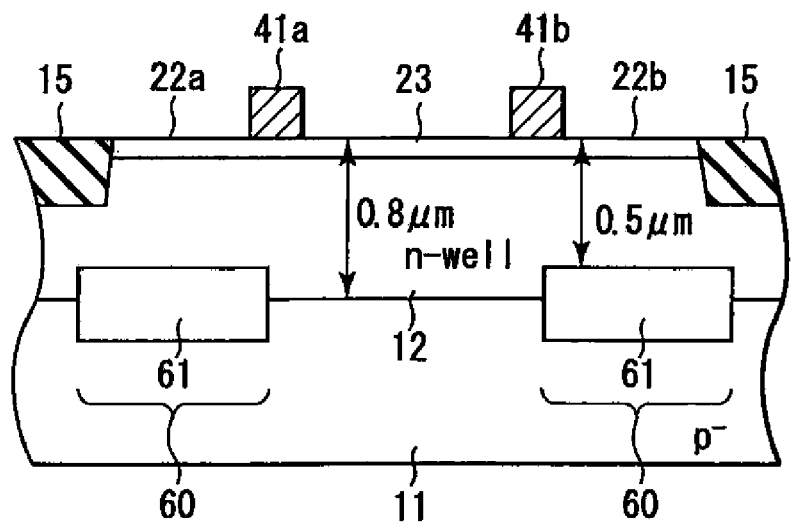
FIG. 9 is a cross-sectional view of the SRAM cell shown in FIG. 6, taken along line IX-IX.

FIG. 6 to FIG. 9 show the basic structure of a memory cell of an SRAM (hereinafter referred to as "SRAM cell") according to a second embodiment of the present invention. In this embodiment, a description is given of the case where a triple-well structure is employed to improve the stability of the circuit against soft errors. FIG. 6 is a partially see-though plan view, and FIG. 7 is a cross-sectional view taken along line VII-VII in FIG. 6. FIG. 8 is a cross-sectional view taken along line VIII-VIII in FIG. 6, and FIG. 9 is a cross-sectional view taken along line IX-IX in FIG. 6. In these Figures, the parts common to those in FIG. 1 are denoted by like reference numerals, and a detailed description is omitted.

In this embodiment, as shown in FIG. 6 to FIG. 9, for instance, a triple-well structure is formed. In the triple-well structure, an n-type buried layer 61 is buried immediately below the n-well 12 and p-well 13 in a region (region 60) where the resistance to soft errors is low. In the other region, a conventional well structure (twin-well structure) is formed. The depth of each of the p-well 13 and n-well 12 (i.e. distance from the cell surface to the deepest part) is about 0.5 μm within the region 60, and is about 0.8 μm in the other region. The depth of the n-type buried layer 61 (i.e. distance from the cell surface to the deepest part) is about 1.0 μm to 1.2 μm.

In the present embodiment, the n-type buried layer 61 is present only within the region 60. Thus, it should suffice if the characteristics of insulation/isolation between the n-type buried layer 61 and the drain region 32a and the resistance characteristics of the n-well 12 are optimized only for the region 60. There is no need to optimize these characteristics for the entire region of the circuit. Hence, the SER can efficiently be reduced.

Like the above-described first embodiment, if more importance is placed on the circuit performance than on the reduction in SER, it should suffice to reduce the number of locations of formation of n-type buried layers 61. The method of determining the location of formation of the n-type buried layer 61, which can realize the SER of a desired value or less, is substantially the same as in the first embodiment.

In the case of the SRAM cell, as has been described in connection with the first embodiment, the drain region 22a, 22b on the n-well 12 has a lower probability of occurrence of soft errors than the drain region 32a, 32b on the p-well 13. If importance is placed on the circuit performance, for example, as shown in FIG. 10 to FIG. 13, an n-type buried layer 61 for realizing a triple-well structure may selectively be formed only in a region (region 60a) immediately below the p-well 13 that corresponds to the drain region 32a, 32b. Thereby, as has been described in connection with the first embodiment, degradation in circuit performance can further be suppressed.

Figure 10:
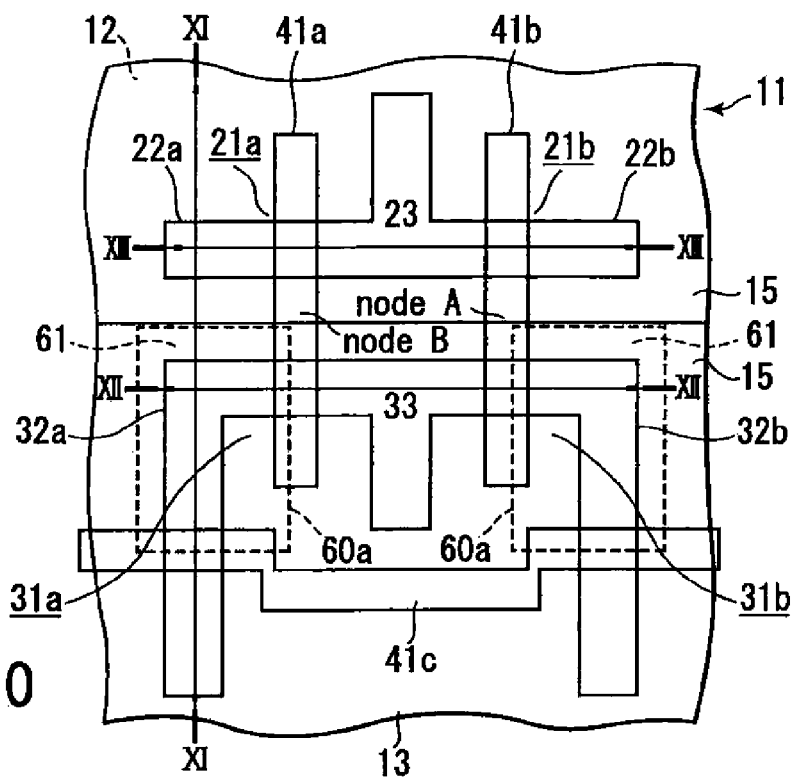
FIG. 10 is a plan view showing another example of the structure of the SRAM cell according to the second embodiment of the present invention.
Figure 11:
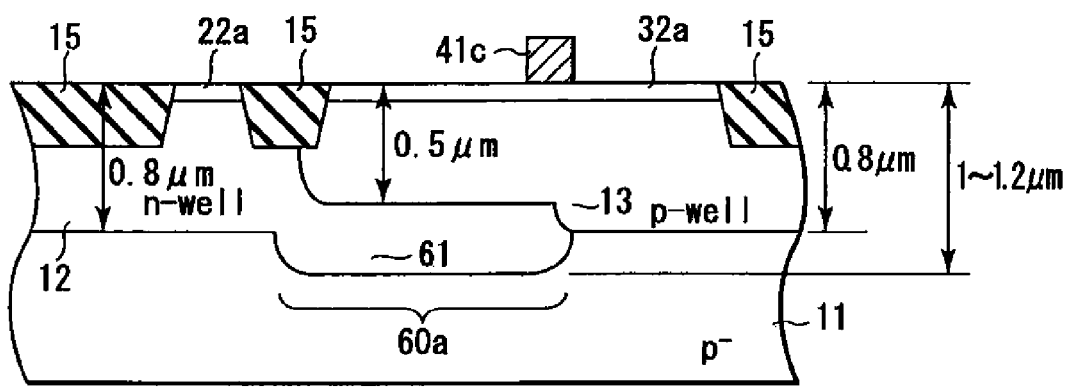
FIG. 11 is a cross-sectional view of the SRAM cell shown in FIG. 10, taken along line XI-XI.
Figure 12:
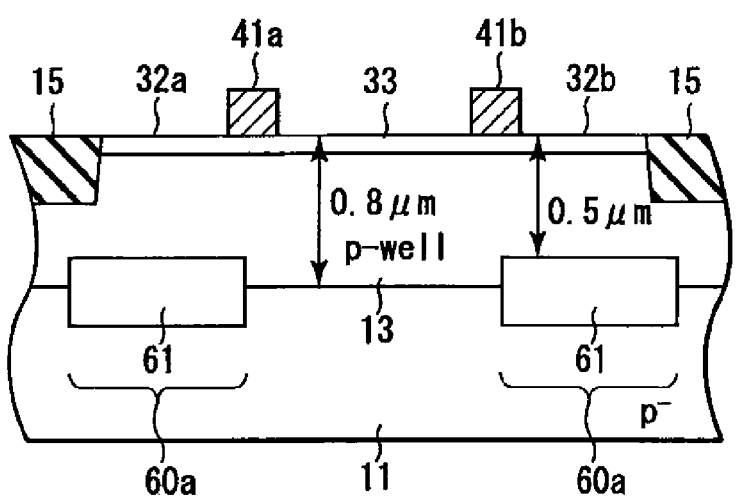
FIG. 12 is a cross-sectional view of the SRAM cell shown in FIG. 10, taken along line XII-XII.
Figure 13:
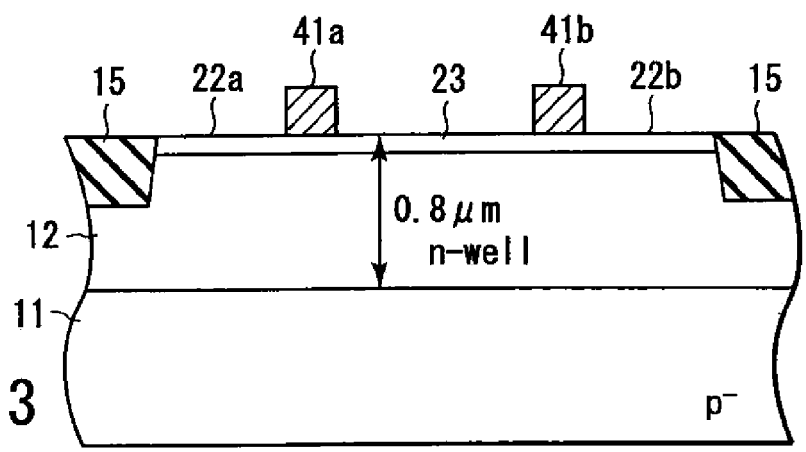
FIG. 13 is a cross-sectional view of the SRAM cell shown in FIG. 10, taken along line XIII-XIII.

FIG. 10 is a partially see-through plan view, FIG. 11 is a cross-sectional view taken along line XI-XI in FIG. 10, FIG. 12 is a cross-sectional view taken along line XII-XII in FIG. 10, and FIG. 13 is a cross-sectional view taken along line XIII-XIII in FIG. 10.

As mentioned above, the triple-well structure is formed in the part immediately below the part that is expected to be most vulnerable to soft errors. Compared to the conventional SRAM, it is easier to suppress injection of current due to cosmic rays. Furthermore, since the triple-well structure can selectively be formed, an increase in chip area and degradation in circuit performance can be suppressed to a minimum necessary level.

As has been described above, the measure to soft errors is intensively taken on the locations where soft errors would easily occur. Thereby, the resistance to soft errors can be improved without degrading the circuit performance or greatly increasing the chip area. As a result, the soft error rate can be reduced while the degradation in circuit performance and the increase in chip area are limited to a minimum necessary level.

The first and second embodiments may be combined. In this case, for example, as shown in FIG. 6 to FIG. 9, a high-concentration well region with a depth of about 0.5 μm and an impurity concentration of $5 \times 10^{18}/\text{cm}^3$ at a junction interface with each drain region 22a, 22b, 32a, 32b is formed in the region 60. In the other region, a well region with a depth of about 0.8 μm and an impurity concentration of $10^{18}/\text{cm}^3$ at a junction interface with each source region 23, 33 is formed. Thereby, the SER can further be reduced. If more importance is placed on the circuit performance than on the reduction in SER, a high-concentration well region is formed only at a location with high probability of soft errors (e.g. region 60a in FIG. 10 to FIG. 13). In this case, the SER can be reduced while the circuit performance is maintained.

In the first and second embodiments, the SER can efficiently be reduced by adding a load capacitance or partially changing the well structure. In the manufacture of actual products, the location that requires such a change (i.e. location that is vulnerable to soft errors) can be estimated by an advance study by means of simulation or experiments.

Figure 14A:
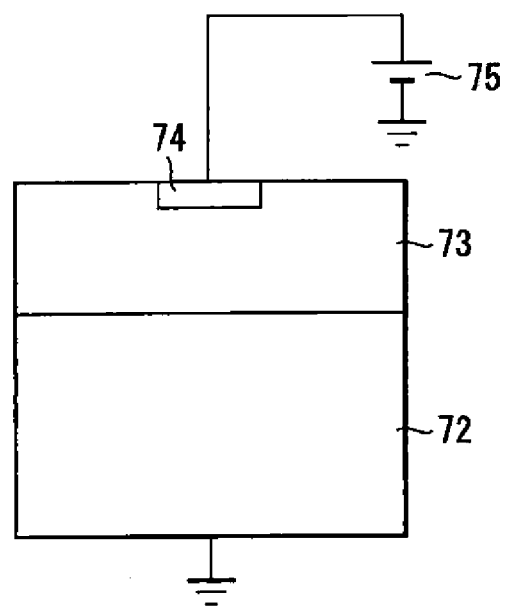
FIG. 14A and FIG. 14B show structures of devices that are used to estimate, by an advance study, portions that are vulnerable to soft errors.
Figure 14B:
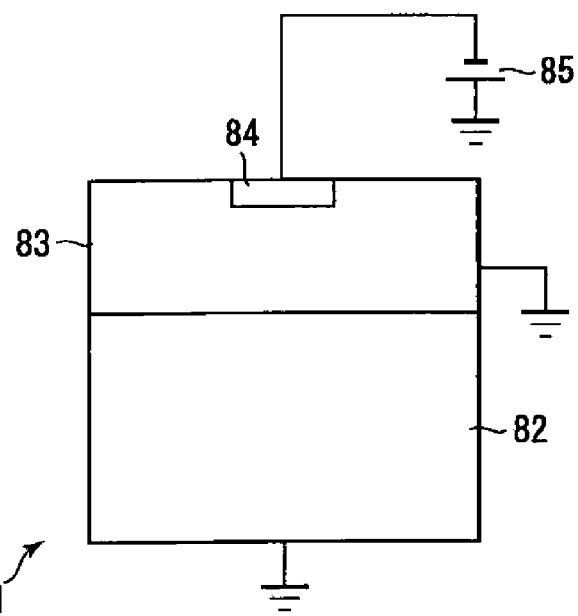

Specifically, as shown in FIGS. 14A and 14B, a current waveform $I_{SEU}$ is calculated. The current waveform ISEU occurs when cosmic rays are made incident on an n⁺-diffusion region 74 formed on a surface portion of a p-type well region 73, which is formed on a p-type silicon substrate 72 constituting a device 71. In addition, the current waveform $I_{SEU}$ occurs when cosmic rays are made incident on a p⁺-diffusion region 84 formed on a surface portion of an n-type well region 83, which is formed on a p-type silicon substrate 82 constituting a device 81. In this case, the devices 71 and 81 are formed similar to structures in the vicinity of diffusion layers of an n-type MOS transistor and a p-type MOS transistor. These devices 71 and 81 are reproduced by process simulation. In addition, the conditions for formation of the p-type well region 73 and n-type well region 83 are determined so as to meet the device isolation characteristics and the tolerance range of well resistance. The data on the device isolation characteristics and the tolerance range of well resistance is acquired in advance by simulations or experiments.

A method of calculating the current waveform ISEU is described. To start with, the energy of incident cosmic rays, nuclear species, incident angle and incident position are set. Base on these data items, a trajectory of cosmic rays that cross the substrate 72, 82 is calculated. Next, electron-hole pairs generated along the trajectory are counted. Finally, the behaviors of the generated electron-hole pairs are calculated using the Poisson's equation and current continuity equations.

An example of the specific method for calculating the current waveform ISEU is described, for instance, in "Integrated Systems Engineering AG, Zurich, TCAD DESSIS 8.0 Manual".

From the results of studies thus far, it is understood that the current waveform $I_{SEU}$ is variable depending on the energy of incident cosmic rays, nuclear species, incident angle and incident position. It is thus ideal to calculate the current waveform $I_{SEU}$ for all possible conditions of incidence. However, in order to save the amount of calculations, it is possible to calculate the current waveform $I_{SEU}$ for only a typical condition of incidence. In subsequent circuit simulations, the current waveform $I_{SEU}$ for the is typical condition of incidence may be used.

Using the obtained current waveform $I_{SEU}$, a circuit simulation relating to the variation in output of the circuit is performed. In the circuit simulation, the current waveform $I_{SEU}$ is treated as a current source 75, 85. Specifically, by connecting the current source to the node ($n^+$-diffusion region 74, $p^+$-diffusion region 84) in the circuit, the situation in which cosmic rays have entered the circuit is estimated by simulation. It is desirable that the circuit simulation be conducted on all the nodes in the circuit. The time for the circuit simulation, however, can be reduced by the following manner. The studies conducted thus far demonstrate, for example, that soft errors would easily occur in the diffusion layers (drains) of a so-called "non-fixed-potential" n-type MOS transistor and p-type MOS transistor, which are not connected to a power supply (Vdd) or a ground (Vss). Hence, it is possible to preferentially simulate the nodes relating to these diffusion layers. Then, based on the result of the circuit simulation, the node with a varied output is determined to be the location with high probability of occurrence of soft errors, and the above-mentioned addition of load capacitance and alteration of well structure are carried out.

Both the first and second embodiment are suitably applicable to SRAMs of the generation of the 90 nm technology node with a cell size of, e.g. 1.26 µm×0.92 µm. In particular, the first and second embodiments are effectively applicable to CMOS LSIs, especially SRAMs, of generations following the 90 nm technology node.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
a semiconductor substrate of a first conductivity type;
a well of the first conductivity type formed in a surface of the semiconductor substrate of the first conductivity type;
a first MOS transistor of the a second conductivity type formed on the well of the first conductivity type;
a second MOS transistor of the second conductivity type formed on the well of the first conductivity type, the second MOS transistor of the second conductivity type being adjacent to the second MOS transistor of the first conductivity type, the first and second MOS transistors of the second conductivity type having sources connected to each other and connected to a first power supply;
a well of a second conductivity type formed in the surface of the semiconductor substrate of the first conductivity type, the well of the second conductivity type being adjacent to the well of the first conductivity type with an element isolation region interposed therebetween;
a first MOS transistor of the first conductivity type formed on the well of the second conductivity type, the first MOS transistors of the first and second conductivity types having gates connected to each other;
a second MOS transistor of the first conductivity type formed on the well of the second conductivity type, the second MOS transistors of the first and second conductivity types having gates connected to each other, the first and second MOS transistors of the first conductivity type having sources connected to each other and connected to a second power supply; and
a buried region of the second conductivity type not provided under other areas except for under drain regions of the first and second MOS transistors of the first and second conductivity types and the element isolation region.

2. The semiconductor memory device according to claim 1, wherein the buried region of the second conductivity type is determined based on preparatory studies by a circuit simulator or experiments.

3. The semiconductor memory device according to claim 1, wherein the first and second MOS type transistors of the first and second conductivity types include at least an n-type MOS transistor, and
a drain of the n-type MOS type transistor is vulnerable to soft errors.

4. The semiconductor memory device according to claim 3, wherein the semiconductor memory device is a static random access memory (SRAM) type memory cell having a flip-flop circuit that comprises a plurality of the n-type MOS transistors and a plurality of p-type MOS transistors.

5. The semiconductor device according to claim 1, wherein the first and second MOS type transistors of the first and second conductivity types include at least an n-type MOS transistor and a p-type MOS transistor, and
a drain of the n-type MOS transistor and a drain of the p-type MOS transistor are vulnerable to soft errors.

6. The semiconductor device according to claim 5, wherein the semiconductor memory device is a static random access memory (SRAM) type memory cell having a flip-flop circuit that comprises a plurality of said n-type MOS transistors and a plurality of said p-type MOS transistors.

7. A semiconductor memory device comprising:
a semiconductor substrate of a first conductivity type;
a well of the first conductivity type formed in a surface of the semiconductor substrate of the first conductivity type;
a first MOS transistor of the a second conductivity type formed on the well of the first conductivity type;
a second MOS transistor of the second conductivity type formed on the well of the first conductivity type, the second MOS transistor of the second conductivity type being adjacent to the first MOS transistor of the second conductivity type, the first and second MOS transistors of the second conductivity type having sources connected to each other and connected to a first power supply;
a well of a second conductivity type formed in the surface of the semiconductor substrate of the first conductivity type, the well of the second conductivity type being adjacent to the well of the first conductivity type with an element isolation region interposed therebetween;

a first MOS transistor of the first conductivity type formed on the well of the second conductivity type, the first MOS transistors of the first and second conductivity types having gates connected to each other; and a second MOS transistor of the first conductivity type formed on the well of the second conductivity type, the second MOS transistors of the first and second conductivity type having gates connected to each other, the first and second MOS transistors of the first conductivity type having sources connected to each other and connected to a second power supply;

the semiconductor substrate of the first conductivity type, the well of the second conductivity type, the well of the first conductivity type, and at least one of drain regions of the first and second MOS transistors of the second conductivity type being not laminated in the order listed under other areas except for under drain regions of the first and second MOS transistors of the second conductivity type.

8. The semiconductor memory device according to claim 7, wherein the well of the second conductivity type is determined based on preparatory studies by a circuit simulator or experiments.

9. The semiconductor memory device according to claim 7, wherein the first and second MOS type transistors of the first and second conductivity types include at least an n-type MOS transistor, and a drain of the n-type MOS type transistor is vulnerable to soft errors.

10. The semiconductor memory device according to claim 9, wherein the semiconductor memory device is a static random access memory (SRAM) type memory cell having a flip-flop circuit that comprises a plurality of the n-type MOS transistors and a plurality of p-type MOS transistors.

* * * * *